United States Patent [19]
Scherzer

[11] Patent Number: 5,434,400
[45] Date of Patent: Jul. 18, 1995

[54] METHOD AND APPARATUS FOR DECODING F2F SIGNALS READ FROM A MAGNETIC DATA CARRIER

[75] Inventor: Helmut Scherzer, Herrenberg-Gueltstein, Germany

[73] Assignee: International Business Machines Corporation, Armonk, N.Y.

[21] Appl. No.: 48,098

[22] Filed: Apr. 15, 1993

[30] Foreign Application Priority Data

Apr. 15, 1992 [EP] European Pat. Off. ........... 92106505

[51] Int. Cl.⁶ .......................... G06K 7/08; G11B 5/09; G11B 20/14; G11B 20/16
[52] U.S. Cl. ...................................... 235/449; 360/44
[58] Field of Search ............. 360/2, 43, 44; 235/436, 235/466, 463, 449, 380, 483, 462; 341/70, 71, 50; 380/23; 375/1, 14

[56] References Cited

U.S. PATENT DOCUMENTS

| | | | |
|---|---|---|---|
| 3,938,090 | 2/1976 | Borison et al. | 340/149 A |
| 4,044,331 | 8/1977 | Garofalo et al. | 364/900 |
| 4,486,653 | 12/1984 | Powell | 235/449 |
| 4,788,420 | 11/1988 | Chang et al. | 235/449 X |
| 5,019,696 | 5/1991 | Chang et al. | 235/436 |
| 5,168,275 | 12/1992 | Harrison et al. | 341/71 |
| 5,204,513 | 4/1993 | Steele | 235/449 |

Primary Examiner—Aristotelis Psitos
Assistant Examiner—Patrick Wamsley
Attorney, Agent, or Firm—A. P. Tennent

[57] ABSTRACT

A method for decoding F2F signals as well as a device for decoding F2F signals read from a magnetic data carrier is provided. The signal read from the card by a magnetic reading head is amplified by an amplifier with a very high gain, discriminated in a discrimination and integration station to receive a binary looking signal. Out of this digitized signal in a reference time acquisition station a start-up time value is set and a phase is estimated to determine the correct end of a bit cell in a phase estimating station. In a symbol correlation station the received binary signal is correlated with all possible symbol combinations based on the estimated phase to create a correct bit stream. This bit stream might be processed further by a bit recovery station providing a corrected bit stream ready for interpretation.

19 Claims, 10 Drawing Sheets

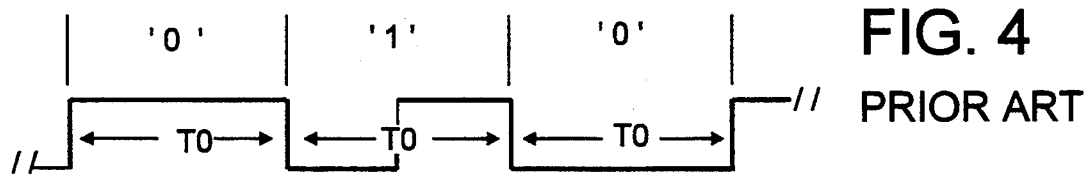
FIG. 4 PRIOR ART
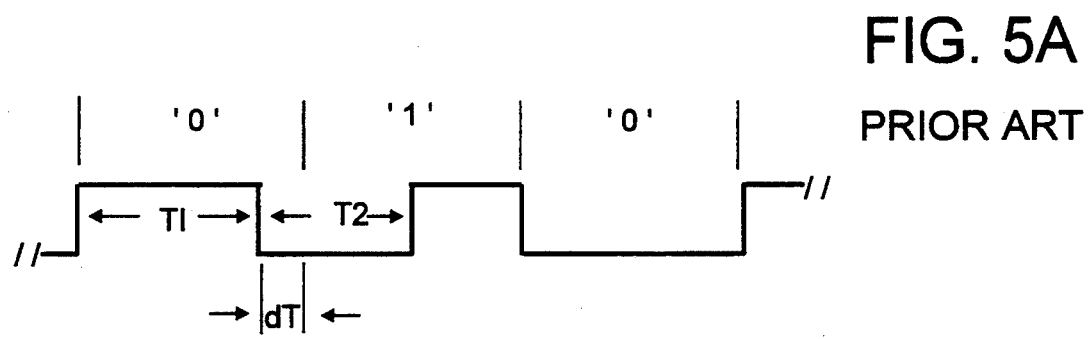
FIG. 5A PRIOR ART
FIG. 5B PRIOR ART
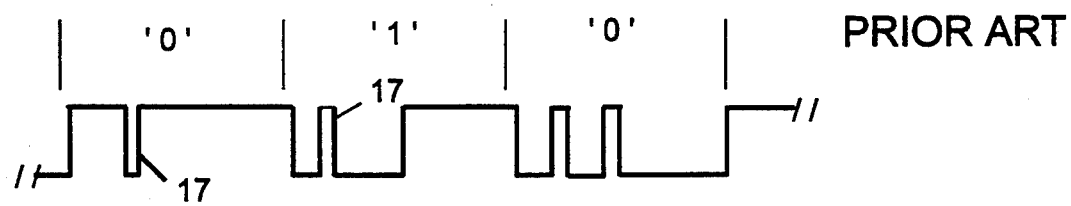
FIG. 5C PRIOR ART
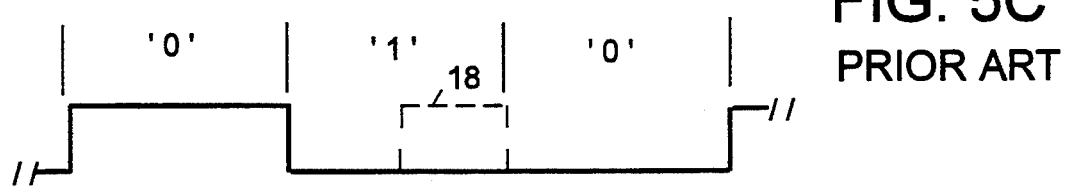
FIG. 5D PRIOR ART
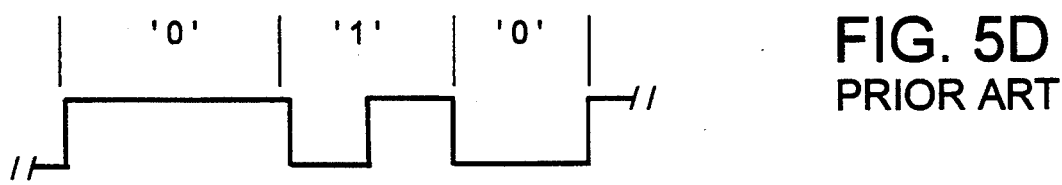

k = + 8
k = - 8
k = 4
k = - 4

SIGNAL 1 u1(t)

×

SIGNAL 2 u2(t)

=

SIGNAL 1 * SIGNAL 2 s(t)

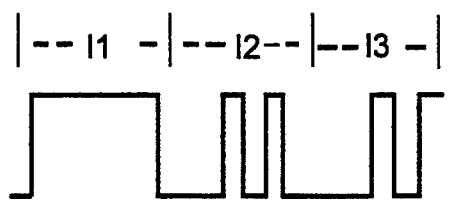
FIG. 16
FIG. 17
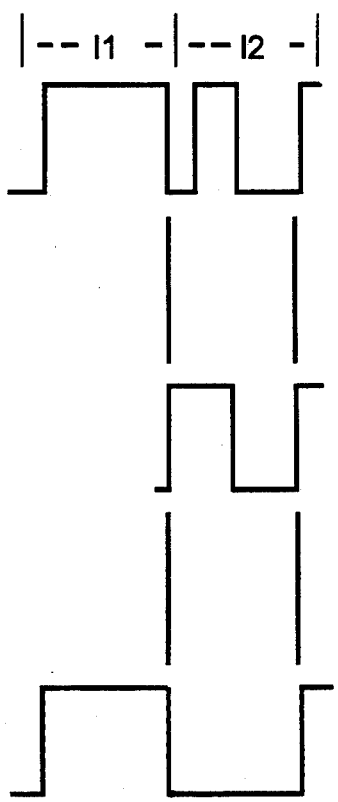

METHOD AND APPARATUS FOR DECODING F2F SIGNALS READ FROM A MAGNETIC DATA CARRIER

BACKGROUND OF THE INVENTION

1. Field of the Invention

The invention relates to a method for decoding F2F signals that are read from a magnetic data carrier, preferably a card carrying magnetic stripe (magnetic card), with the help of a magnetic read head. Furthermore, the invention relates to a device for decoding signals coded in F2F manner contained on a magnetic data carrier.

2. Description of Related Art

From U.S. Pat. No. 4,626,670 a method and system for decoding time-varying two-frequency (F2F), coherent phase-data, such as data from the stripe on a magnetic stripe-bearing medium is known which includes detecting flux intervals at the beginning of a bit cell of such data. This method further includes the timing of the length of such a bit cell with a clock or counter, digitally determining the average length of at least the two bit cells immediately preceding the cell being measured and digitally determining whether or not another flux reversal lies at or near the mid-point of the bit cell being decoded. Besides the fact that this known method differs structurally from the method used in the present invention, it seems also to be very sensitive to misinterpreting amplified noise or signal distortions that indicate cell boundaries where no cell boundaries are provided.

From U.S. Pat. No. 3,959,626 and U.S. Pat. No. 3,947,662 a method and apparatus is known for reading F2F coded data. The method and apparatus include means for simultaneously or separately accommodating both variable velocity scan or distorted reception conditions in the coded data or other variations in the spacing of transition signals in the recorded indicia. Frequency variations in transmitted data are accommodated. Correct interpretation of frequency-distorted transmitted data is made possible by optimizing the re-scanning time-point either out of F1 or F2. This known method and apparatus follows a different solution than the one presented by the present invention.

In the European patent application EP-A- 0 441 280 (U.S. Pat. No. 5,168,275, filed in the U.S. on Feb. 7, 1990) a method and apparatus for decoding two-frequency (F2F) data signals is described. There a two-frequency data signal, also known as a bi-phase or F2F signal, is accurately decoded by sampling the signal and digitizing the samples to provide a series of digital values representing the signal. An intelligent digital filter manipulates the digital values to decode the signal, by detecting the peak in the sample of the signal and decoding the signal by analyzing the location and amplitudes of the peaks. Only peaks which are outside a guard-band may be detected. If the signal cannot be properly decoded with a wide guard-band, the guard-band may be repeatedly narrowed, until a minimum guard-band is reached. Bits are identified by comparing the displacements between peaks to a bit cell width. An even number of displacements indicates a "0" bit, and an odd number of displacements indicates a "1" bit. Once a bit is decoded, the bit cell width is incremented by a predetermined amount if the decoded bit cell width is narrower than the current bit cell width. If no peaks are found within a maximum allowable bit cell width, this area is delimited as bad. An attempt is made to decode the bits in the bad area by analyzing all peaks without regard to a guard-band. After decoding, the bits are converted into bytes. Parity and longitudinal redundancy code checks are used to correct bad bits. During decoding, many indications of a degraded signal may be obtained. If a degraded signal is indicated, the host computer is notified, even if the signal was properly read. Card replacement can then be initiated at the first signs of signal degradation before the data signal becomes unreadable. The present invention follows a different method in signal decoding.

The signal quality of F2F encoded data is often bad. For example, frequent usage of a magnetic stripe card in financial applications(e.g., cash feeding at cash issuing terminals, payments at point of sales terminals, payment at gasoline stations, or use in a telephone cell for paying the bill), impacts very much on the signal quality of the magnetic stripe card. Therefore, amplitude fade and jitter may generate retries to read the card which further degrades the magnetic stripe. Sometimes the data on the card cannot be read any more. Different effects are responsible for the reduced quality of the read signal: fading, jitter, signal drop-outs or so-called glitches which represent additional spikes in the digitized signal.

SUMMARY OF THE INVENTION

It is the object of the present invention to present a method and a device which is able to recover the correct signal as far as possible even under very difficult circumstances of weak magnetic signals and signal distortions within the digitized signal.

This object as well as other objects are advantageously solved by the invention in using the features laid down in the independent method and device claims.

Further advantageous developments are laid down in the respective sub-claims.

The foregoing and other objects and advantages of the present invention will be apparent to those skilled in the art in view of the accompanying drawings, description of the invention, and appended claims.

BRIEF DESCRIPTION OF THE DRAWINGS

In the description that follows, the invention and details of the invention will be described in connection with examples shown in the accompanying drawings, in which

FIG. 4 shows schematically the phase definition of an F2F encoding technique;

FIG. 5 shows in FIG. 5A to 5D four different distortions in the discriminated signals representing jitter, glitches, fail-outs and fading;

FIG. 16 shows schematically an example of the overlap estimation; and

FIG. 17 shows schematically an example for the overlap requirement in the signal correlation stage.

DESCRIPTION OF THE PREFERRED EMBODIMENT

First for a better understanding of the invention and its overall application, a card 1 containing a magnetic stripe with three tracks will described in more detail. This magnetic card 1 is an example for a magnetic data carrier on which F2F-signals are encoded.

Figure 1:
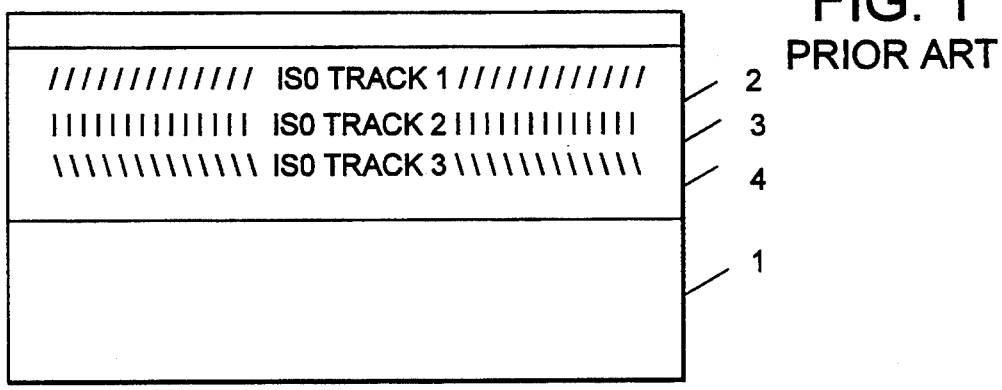
FIG. 1 shows a magnetic stripe card with three tracks.

Typically on a magnetic identification card, such as card 1 shown in FIG. 1, three tracks may be found. In financial applications, track 2, 3 in FIG. 1 is normally read only, while track 3, referenced as 4 in FIG. 1, is capable of being written-on to save the current transaction data, for example, the data of the last money transaction from a money dispensing unit. Therefore, track 3 is exposed to identification card readers in banking applications and therefore is the most probable source for producing bad signal quality.

Track 2, referenced as 3 in FIG. 1, is never written-on. Thus, if electromagnetic signals interfere with the signal quality on this track, no attempt is made to rewrite the track to improve signal quality.

In accordance with the standard values set by the International Standard Organization (ISO), the bit density is 210 BPI (bits per inch) on track 1, 75 BPI on track 2, and 210 BPI on track 3. There are low coercivity cards with about 32,000 A/m (400 Oerstead) for most applications, but there are also high coercivity cards with about 480,000 A/m (6000 Oerstead) for certain applications.

Figure 2:
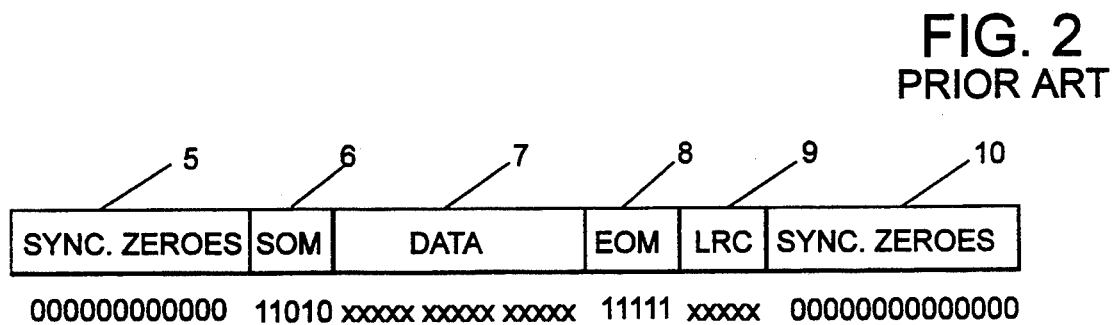
FIG. 2 shows the track-structure according to ISO (International Standard Organization)

A typical track structure in accordance with the ISO standards shown in FIG. 2, starting with a field 5 containing synchronization zeros. Then follows a field 6 containing the start of message SOM signal, followed by a data field 7 containing the data to be used. The data field is followed by the end of message EOM field 8 which is followed by a field 9 containing the length of record character LRC. The last field 10 is again a field containing synchronization zeros. In the data field 7 of track 3 with a bit density of 210 BPI, there is enough space for about 700 bits.

Figure 3:
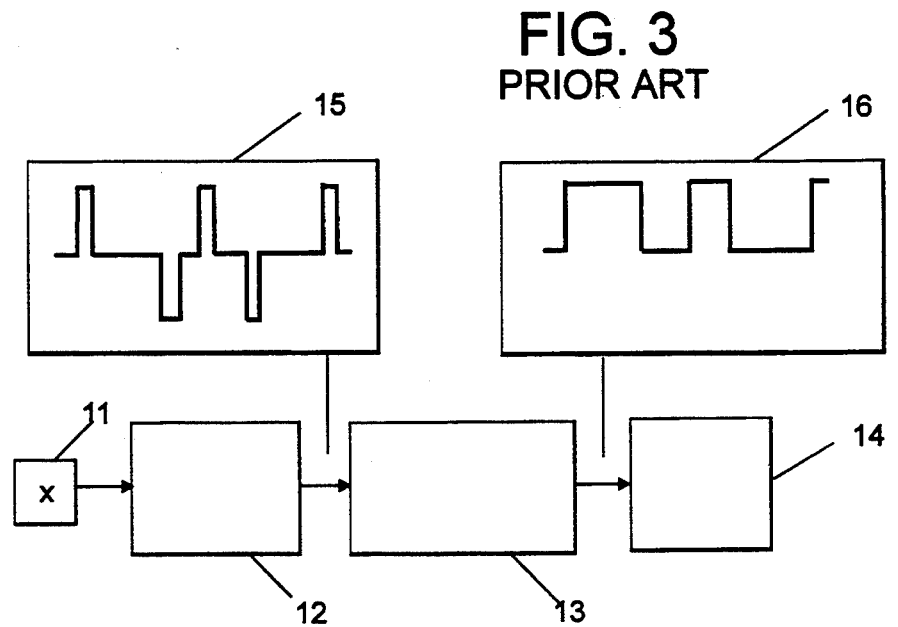
FIG. 3 shows typical read decoding circuitry which is used in the prior art and signals pertaining to different stages.

Typical read and decoding circuitry is schematically shown in FIG. 3. A magnetic head 11 reads the tracks or one track respectively and acquires the analog signal at a level of usually several millivolts. Old heads may cause glitches in writing the signal on the card. They also produce amplitude fading. The signals detected by magnetic head 11 are amplified and passed through a low pass filter in the amplifier station 12. The amplifier increases the input voltage of, usually several millivolts to a level of about 5 volts. The included low pass filter removes high frequency interference. In box 15 above the output line of amplifier 12 an example is shown representative of the analog head signal. It shows positive and negative rectangular peaks arranged on both sides of the groundline.

The low pass filter included in amplifier 12 can be optimized for optimum filtering. This requires expensive hardware including analog digital converter and digital signal processors. In most cases it is not supportable to implement sophisticated filter algorithms into the amplifier. Therefore, typically a sharp analog filter, for example a four-pole filter, will be used. The filtering in the amplifier will not be considered furthermore in connection with the present invention.

The signal amplified and filtered by station 12 is input to station 13 which includes a discriminator and an integrator. The discriminator generates the digital form of the analog input by applying a clip level. It normally consists of a level detector and an hysteresis to avoid transition noise which is generated at the switching level of the discrimination. There, very small signal noise may precipitate output toggling. The discriminated signal shown schematically in box 16 above the output line of station 13 is input to station 14. This station 14 forms the decoder which decodes the discriminated signal into a stream of "0" and/or "1" resulting in the desired bit stream.

The F2F encoding technique and the related phase definition is shown in FIG. 4. In the F2F (frequency—double frequency) coding technique a bit cell is defined to be of the same length for both a "0" and a "1". This is shown in FIG. 4. Within the bit cell of a "1" a polarity change of the signal indicates the information Regarding the bit cell for a "1" it can also be interpreted as if the frequency of the rectangular wave is changed to be double as high for the "1" as for the "0". FIG. 4 shows three bit cells "0", "1" and "0". Each bit cell describes one bit having regular phases TO each. The term "phase" is also used as the time value between two bit value changes. Independent from the acquired bit, "0" or "1", the phase will be the value between the reference for an acquired "0". This is always the length of a bit cell for a "0" and "1". The shown time TO can be seen as the phase for each bit and the phase is equal to the length of a bit cell.

In connection with FIG. 5, consisting of FIG. 5A to 5D, four different signal faults or distortions at the level of the discriminated signal are discussed. In FIG. 5A jitter is shown. This jitter is indicated by the time value dT by which the phase length of the first bit cell "0" is shortened with regard to the value T1. The time value T2 of the first half of the second bit cell "1" is lengthened by that same time variation dT. Each acquired time value may have a certain jitter distortion in the discriminated signal. Since jitter is the time difference between an acquired time of two adjacent flux transitions and its default value, the default value is defined. This is also known as the relative error of the time acquisition. Obviously the default value is different for a "0" and a "1", by definition of the F2F decoding method the default value for a "0" is twice the default value of a "1". Jitter may be caused by worn-out read/write heads, inhomogeneities in the magnetic card material, amplitude fades and diffractions, peak shift effects, or other factors. The peak shift effect is when reading bits cells with higher density result in a signal wherein bit cells have slightly expanded into areas of lower density or with other words: a short time value becomes larger and a large time value becomes shorter.

In FIG. 5B so-called glitches 17 are contained in each bit cell, one in the first "0", one in the first half of the "1" and two in the third bit cell, again a "0". Those glitches 17 are small peaks within the acquired signal. They are mainly caused by a write operation for a machine with a worn-out head. Sometimes the design of a high amplifying analog circuit may cause glitches if the magnetization of the card is noisy.

FIG. 5C shows a fail-out or drop-out 18. Those fail-outs or drop-outs may result from an amplitude which is too small to be acquired or if two or more consecutive flux transitions are not recognized anymore. Those fail-outs or drop-outs are the most severe distortions on the card as they impact immediately the information content of the signal. If the loss of information exceeds the system imminent redundancy then the error probability for the decoded bit is 0.5.

FIG. 5D shows the fading phenomena. In fading, the phase changes during acquisition of the signal. That means, for the example as shown in FIG. 5D, that the second and third bit cell "1" and "0" are shorter than the first bit cell. The fading effect is typical for cards being encoded manually(i.e., the card is wiped through a reader by the hand of a user). If this wiping operation changes the velocity and those changes cannot be eliminated by the encoding system, then the bit density on the card varies and so does the phase.

The above mentioned faults in the signal (i.e., jitter, glitches, fail-outs and fading), pose error problems in the decoding. One of the advantages of the present invention is that the error probability due to those faults and distortions in the decoded signal will be minimized. It is a further advantage of the invention that the system redundancy is used to recover lost information.

Figure 7:
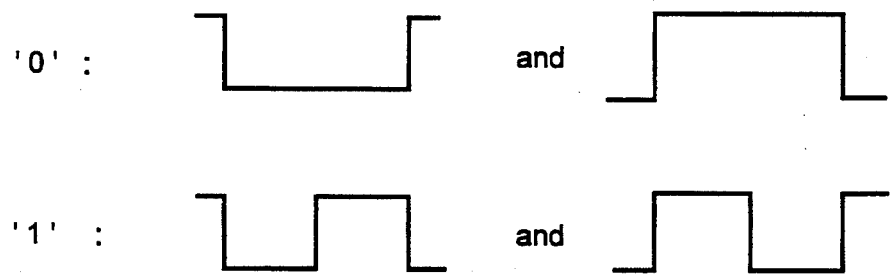
FIG. 7 shows the symbol set for the F2F encoding technique.

The symbol set shown in FIG. 7 shows valid signals for the F2F coding scheme. In the uppermost line two possible symbols for a "0" are shown consisting of a low level signal and a high level signal of the frequency F. The two symbols for a "1" are shown in the lower line, namely a low level followed by a high level of the second frequency 2F and a high level followed by a low level equally of the frequency 2F.

Figure 8:
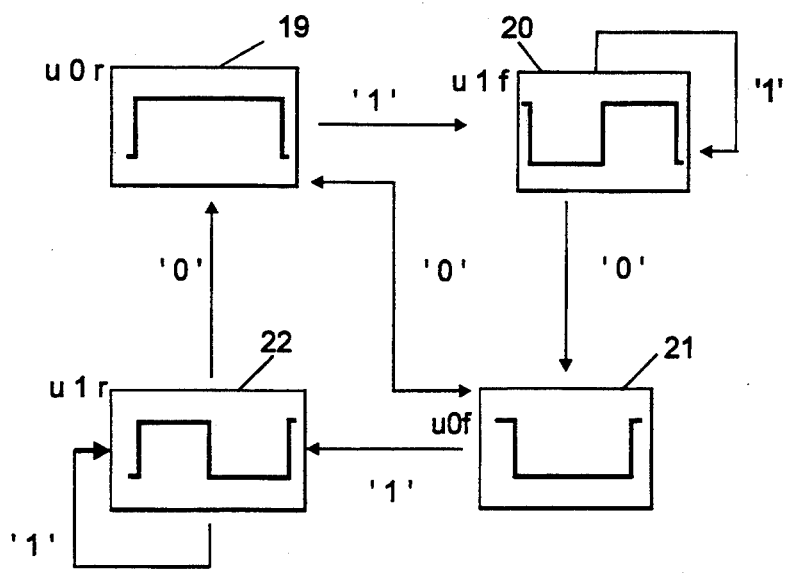
FIG. 8 shows the state diagram for the F2F coding technique.

In FIG. 8 a diagram is shown which shows the different states for the F2F coding scheme. In the upper left corner in box 19 the symbol $U_{OR}$ is shown representing the signal value U for the bit value "0" beginning with the rising edge. A transition to a "1" is possible from this symbol going to the right hand upper corner box 20 showing the symbol $U_{1F}$ representing the "1" starting with a falling edge. This symbol can be repeated within itself to show a "1" again. From there continuing in a clock-wise direction the next transition might be a "0" shown in the bottom right box 21 and indicated by the symbol $U_{OF}$. It shows the "0" beginning with a falling edge. From there the next transition with the value "1" is shown in box 22 and indicated by $U_{1R}$ starting with the rising edge for the representation of a "1". Again this symbol can be repeated within itself with the next value for a "1". Going from box 22 to box 19 the transition is possible from $U_{1R}$ to $U_{OR}$ with a "0" It is also possible, as indicated by the double arrow line "0", that the symbol shown in box 21 can follow the symbol shown in box 19, and vice versa.

Regarding the possible transitions it is obvious that $U_{OR}$ to $U_{OR}$, $U_{OF}$ to $U_{OF}$, $U_{OR}$ to $U_{1R}$, $U_{OF}$ to $U_{1F}$ and $U_{1R}$ to $U_{OF}$, $U_{1F}$ to $U_{OR}$, $U_{1R}$ to $U_{1F}$, $U_{1F}$ to $U_{1R}$, are transitions which are not allowed by the definition of the F2F encoding scheme. This is a system redundancy which may be used for symbol recovery. The present invention uses an overlap estimation technique to reflect these margin conditions, and knowing the 'forbidden' transitions allows a more sophisticated decoding method.

Figure 9:
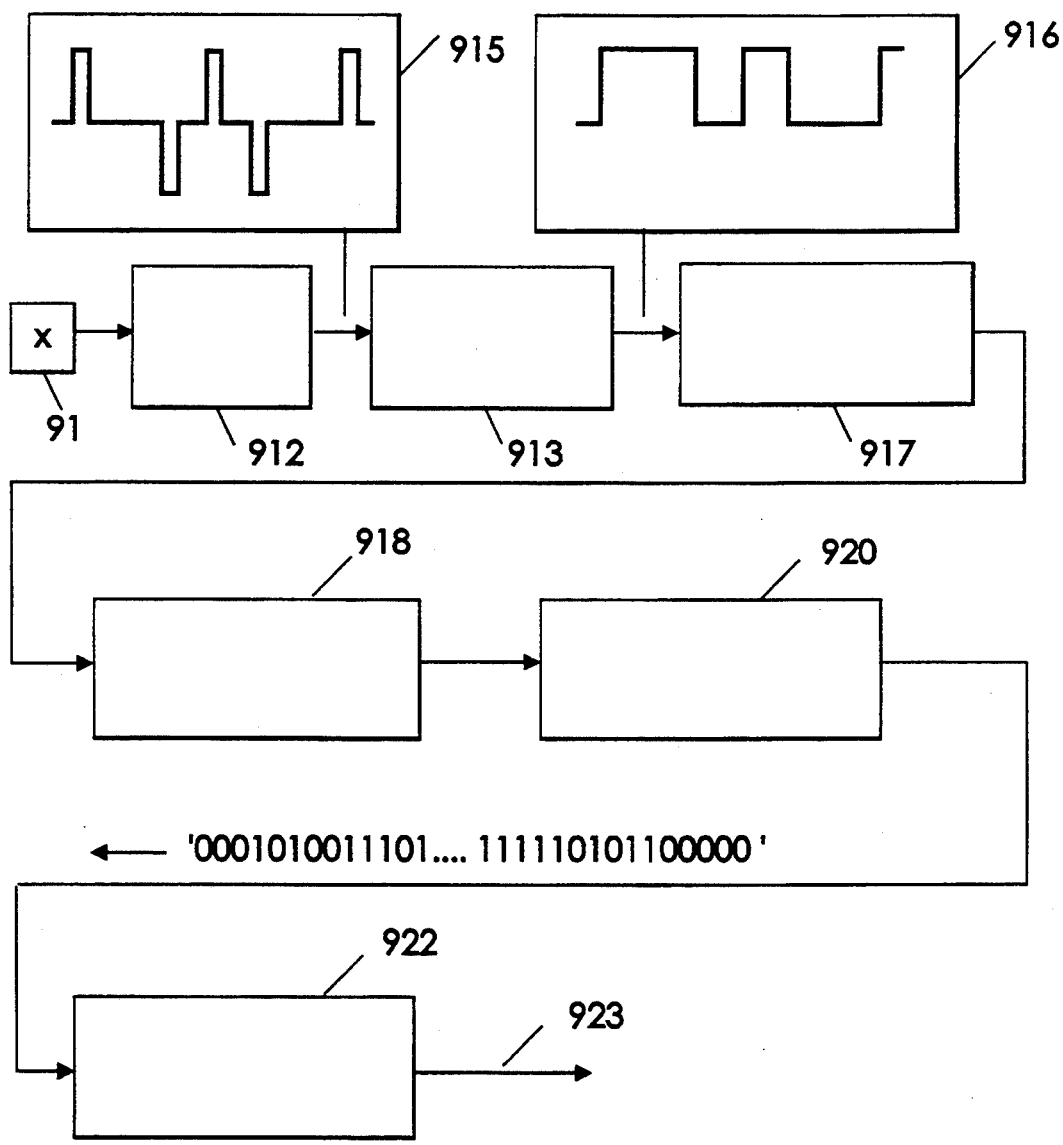
FIG. 9 shows a block diagram of the decoding method and mechanism in accordance with the present invention.

FIG. 9 shows the device in accordance with the present invention for decoding signals coded in F2F manner and read from a magnetic data carrier. Such a magnetic data carrier might be a magnetic card 1 as shown in FIG. 1 containing a magnetic stripe with different tracks. This card 1 is read in a card reader, not shown in more detail, by a magnetic head 91. The signal read by the magnetic head 91 is amplified and passed through a low pass filter in a station 912. The amplifier is of very high gain to amplify also the very low signals into a region where it still can be recognized as valuable contribution in the signal scheme. In box 915 above the output of amplifier station 912 is shown schematically with the analog head signal in its amplified state. This signal is applied as input to a discriminating and integrating station 913 for generating a discriminated signal that looks binary. In box 916 above the output of station 913 this discriminated signal is shown schematically. In the time acquisition station 917 the default value for the expected phase is derived. The phase designates the time which passes from the start to the end of a bit cell. This time is the same for a coded "0" and "1" by the definition of F2F. Out of this a reference phase is extracted which is used as start-up time value for the phase estimation which is performed in phase estimator station 918 to which the output of station 917 is input.

During the phase estimation, two different reference phase values might be used, namely a fixed and a variable reference phase. In the fixed reference phase, the value for the reference phase will not be changed during the whole phase estimation and it is therefore equal to the start-up value. Using a fixed reference phase is referred to as a time-bound method. In applying a variable reference phase the value of the referenced phase changes depending on the actual phase value of the last processed bit cell or several bit cells. It is therefore able to adapt to the fading of the bit cells. The use of a variable reference phase is referred to as a last window method.

The signal output from the phase estimator station 918 is input to a symbol correlation station 920 for correlating the received binary signal stream with all possible symbol combinations based on the estimated phase for generating a bit stream. This output bit stream might be input to a bit recovery station 922. The output 923 of the bit recovery station 922 contains the correct data stream that is ready for interpretation.

Figure 9A:
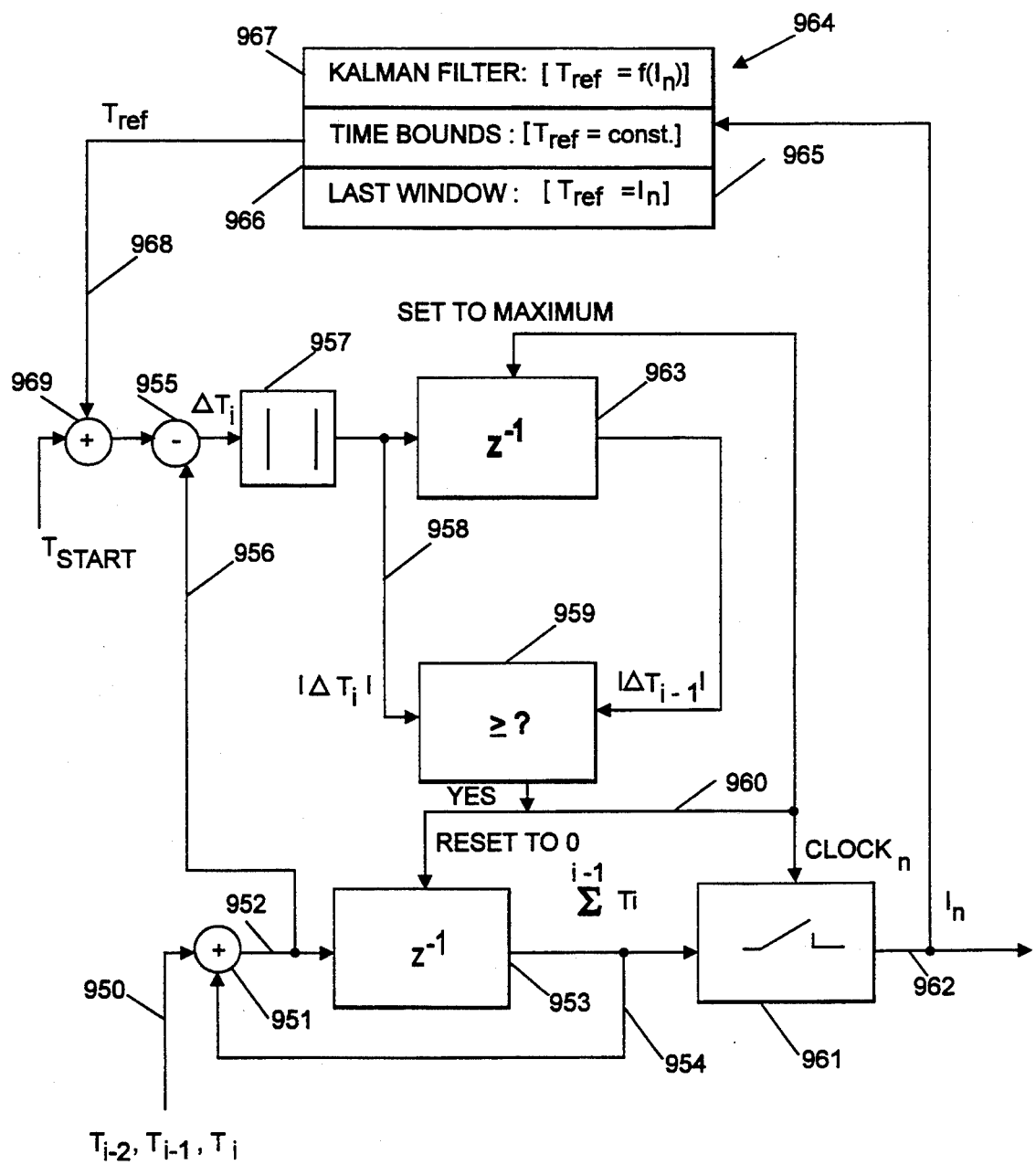
FIG. 9A shows in a block diagram a possible realization of the phase estimator shown in FIG. 9.

FIG. 9A shows in a block diagram a possible realization of the phase estimator 918 shown in FIG. 9. On an input line 950 of a summing point 951 the received signal r(t) including the values for example $T_{i-2}$, $T_{i-1}$, $T_i$ are applied. The received signal represents the time which was measured between adjacent flux transitions. At the output 952 of summing point 951 these values are accumulated through a delay module 953. This delay module (z−1) always shows the input of the preceding clock on its output 954. Thus, at this output 954 the sum of the last recent incoming values $T_{-1}$, $T_{i-2}$, ... are available. The accumulated values $T_i$, $T_{i-1}$, ... are sent to a subtractor 955 over line 956. At this point the accumulated sum is compared with the length of a reference phase $T_{ref}$. The output $\Delta T_i$ from subtractor 955 is applied to an absolute value calculator 957. Over line 958 this absolute value $\{\Delta T_i\{$ is applied to a comparator 959. In this comparator 959 a comparison is made between the actual phase difference $\{\Delta T_i\{$ and the preceding phase difference $\{\Delta T_{i-1}\{$. If the new value of $\{\Delta T_i\{$ is greater than the previous one $\{\Delta T_{i-1}\{$ then a clock pulse is generated and applied on line 960 to switch 961. On the output 962 is the current value of the accumulated time values as an estimate for the current correlation interval $I_n$. The clock pulse on line 960 sets a delay module 969 to the highest value in the number range of the system. To this delay module 963 the current absolute value $\{\Delta T_i\{$ is input and output of this delay line is the preceding phase difference $\{\Delta T_{i-1}\{$, which is applied as input to the comparator 959.

The resulting correlation interval length $I_n$ on line 962 is input to an estimation time value generator 964. In this estimation value generator 964 there are three possibilities for generating the estimation value $T_{ref}$. In box 965 there is indicated the last window method in which the estimation value $T_{ref}=I_n$. In box 966 there is indicated the time bound method in which the estimation value $T_{ref}$ is constant. In box 967 there is indicated the method in which a Kalman filter is used to compute the estimation value $T_{ref}=f(In)$, wherein the estimation value is a function of the actual correlation interval. The output $T_{ref}$ of the estimation value generator 964 is applied on line 968 to an adder 969 which inputs its output to subtractor 955. An initial reference phase value $T_{ref}$ is applied to adder 969 to start the system. After the first clock this value is set to zero to allow the self-adaptation of the unit. Then either the reference value is constant when the time bounds criterion is used as indicated in box 965 and the new phase is supposed to be a constant value. If the last window method is used, as indicated in box 966, of the estimation value generator 964, then the new estimated value for the next phase will be set to the last actual one(i.e., the value of the current correlation interval in). Using a more sophisticated filtering method, like a Kalman filter, may allow a more precise estimation of the incoming next reference phase. This is indicated by box 967 of the estimation value generator 964. Also possible but not indicated in FIG. 9A are non-linear methods which seem to be appropriate for the new reference phase.

The phase estimating station 918 shown in FIG. 9 includes either a minimum distance estimation circuit or an optimum phase estimator. These approaches of the phase estimation are explained below.

Figure 10:
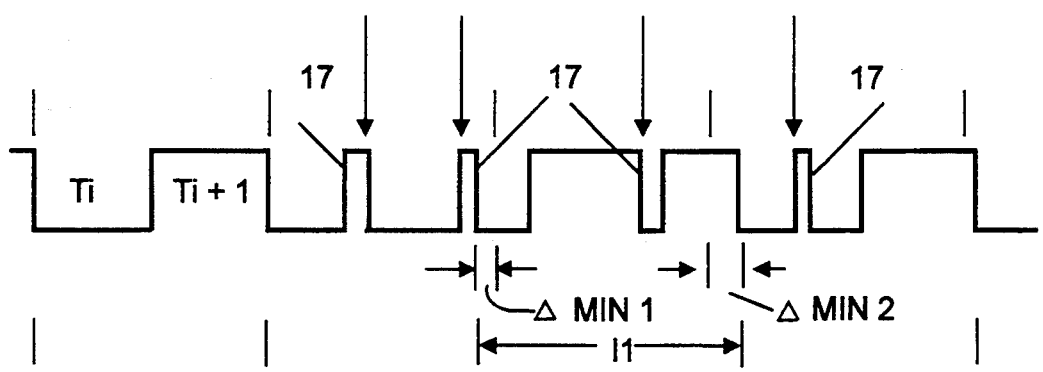
FIG. 10 shows one example of the phase estimation in accordance with the present invention incorporating the minimum distance approach.

Generally it has to be observed that in order to be able to read even low amplitude cards the read amplifier has to be designed with a rather very high gain. Low amplitude cards are those with a small magnetization resulting in an electrical signal on the magnetic read head which might be at about 4% of the nominal value. Very high amplification of amplifier 912 should allow cards at a 5% magnetization, referred to the nominal value, to be discriminated correctly. With this background of very high amplification the probability for glitches increases tremendously. This is due to the noise and small peaks which will be amplified until saturation and therefore cause glitches in the discriminated signal. A typical incoming signal that includes glitches could look as that shown in FIG. 10. The signal depicted contains four glitches 17 indicated also by arrows. The typical problem with phase estimation is to determine where the end of the bit cell is. Glitches 17 might appear as bit cell boundaries. In FIG. 10 in the first line the estimated phase is indicated by small vertical lines. Underneath that a signal line is depicted which includes time values Ti, Ti+1, and so on. In the line beneath that between the third phase estimate line from left and the falling edge of the second glitch 17 from left a first minimum time distance to the reference phase value $\Delta_{min1}$ is indicated. Furthermore between the forth phase estimate line and the falling edge of a signal after the third glitch 17 a second minimum time distance value to the reference phase is indicated by $\Delta_{min2}$. Indicated in the bottom line of FIG. 4 between small vertical lines which do not necessarily coincide with the phase estimate lines in the first line, there is indicated a correlation interval I1. This correlation interval is used later-on with the symbol correlation.

The minimum distance method starts at any known bit cell boundary and integrates or adds respectively the incoming time data Ti, Ti+1, Ti+3, until the distance, that means the absolute difference, between the integral and the reference phase is at a minimum. For a correctly coded card this is typically the case after one or two acquired time data values, one if "0" was sent, two if "1" was sent. The reference phase may be changed to the actual measured value in accordance with the last window method or kept constant by definition within time bounds. The estimated phase locks to the most likely incoming phase. The risk of dropouts is essentially reduced by the high amplifier gain. FIG. 10 shows how the boundaries of the correlation interval I1 are estimated with relation to the most likely flux changes in the boundaries of the reference phase. The acquired sum of the integrated time values Ti, Ti+1 ... is named the correlation interval. After the phase has been estimated the symbol detection will be performed in station 920 of FIG. 9.

The minimum distance phase estimation method is not able to estimate intervals of more than one bit cell. Therefore dropouts cannot be handled correctly since the closest flux change is used.

In a further embodiment of the phase estimation in the sense of an optimum phase estimator, an acceptance criterion for the closest bit cell is added. Thus, the estimation interval is enhanced to multiple bit cell length. If the minimum distance is greater than the acceptance range then the minimum distance for multiple of the referenced phase will be used as minimum distance criteria.

Figure 11:
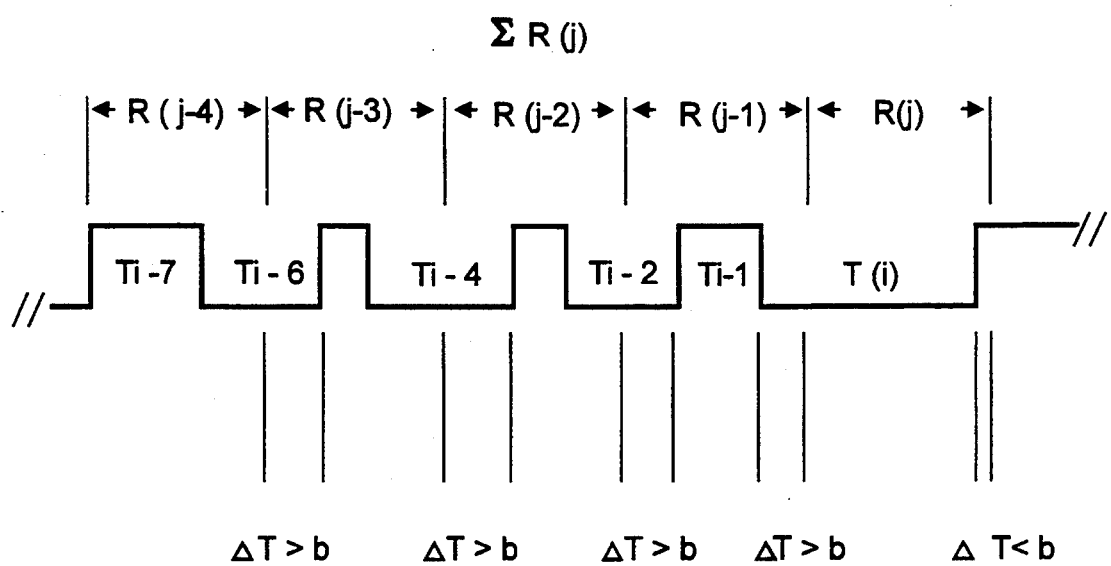
FIG. 11 shows another example of the phase estimation in accordance with the present invention following the decision criteria approach.

FIG. 11 depicts the phase estimation with decision criteria. In the upper line different reference times R(j) are shown of which a sum is formed. In the signal line the time values T(i) are shown. Underneath between lines different values of $\Delta T$ are shown of which four are larger than the decision bound b which forms the acceptance criteria, and only one time difference value for the minimum distance $\Delta T$ is shown to be smaller than b. The decision rule for this optimum phase estimator is that the sum of the acquired time T(i) that is measured between two adjacent flux changes is to be compared to any sum of the referenced times R(j) until the difference between these two sums is less than a decision bound b. The example shown in FIG. 11 demonstrates that the final correlation interval has a length of 5 bit cells. The minimum distance is calculated five times but only the last time the decision criteria $\Delta T>b$ is fulfilled to lock the phase estimation. The values R(j) for the appropriate reference phases should be a function of the noise model and could be generated by a structure used in the estimation theory, for example Kalman filter. Using a decision criterion might be more critical to determine the filter parameter for the generation of R(j) but it allows to correlate even dropouts.

Figure 6:
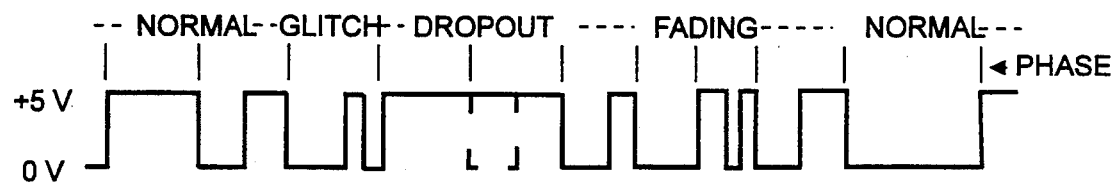
FIG. 6 shows a further example of a discriminated signal containing different signal distortions.
Figure 12:
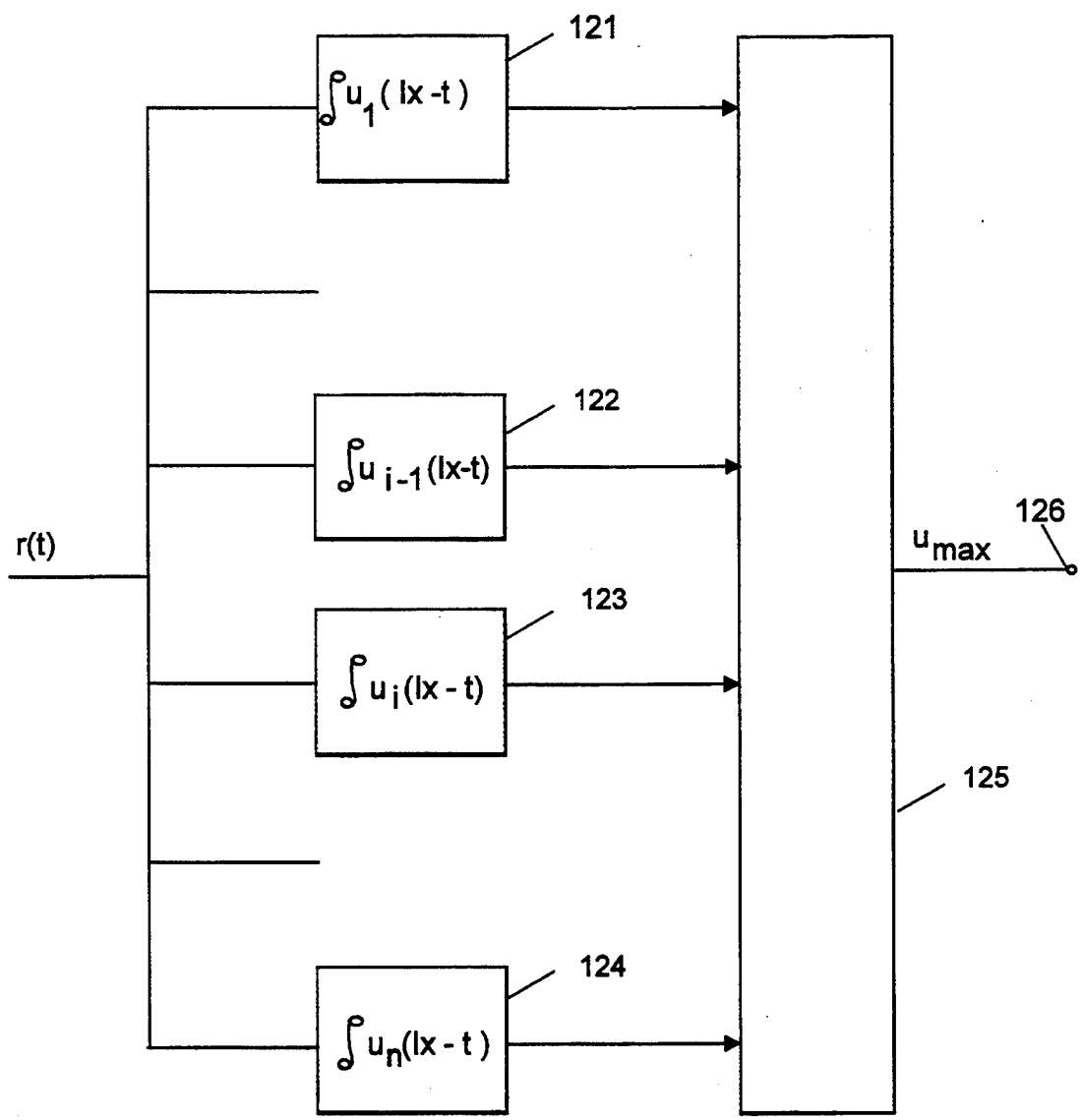
FIG. 12 shows schematically a block diagram of a matched filter bank and a maximum selector used for signal correlation.

The symbol correlation is done in the symbol correlator 920 as shown in the arrangement depicted in FIG. 9. After the phase estimation has been performed, a set of correlation intervals $I_1, \ldots, I_n$ is available. Now with the enhanced decoding method of the present invention a correlation between the received signal r(t) and possible symbol sequences is performed to maximize the correlation and thus to determine the symbol. The possible symbol sequences are shown in FIG. 7. In FIG. 12 a matched filter bank is shown containing a set of filters of which four filters 121, 122, 123 and 124 are shown, indicating the bank of matched filters. The outputs of these filters are input to a maximum selection device 125, and on the output 126 of this device the maximum output $U_{max}$ is given. The received signal r(t), of which an example is shown in FIG. 6, is the signal read actually from the card and already discriminated to a binary level. With $U_i(t)$ in the different filters 121–124 there is indicated in each case one symbol out of a set of symbols which might have been sent. As it is unknown what was actually sent, all possible combinations have to be generated and tested in the matched filters. For one bit cell the set of possible receptions is identical with the set of symbols shown in FIG. 7. For a test length of more than one bit cell any allowed combination as shown in FIG. 8 of the possible symbols have to be tested. With t the time parameter is denoted. With T the length of the estimation interval is indicated. The optimum would be to have the correlation interval as long as the signal was acquired from the card. However, the number of symbol combinations to be correlated is about $2^{600}$ which exhausts any capability of the calculation resources. Therefore, a variable test interval has been generated by the phase estimator as already described. The time value $I_x$ denotes the length of the variable test interval.

In the enhanced decoding method of the present invention the result which is being calculated by filtering the received signal r(t) with the matched filters is maximized for all possible symbol combinations during the current test interval length and a following integration. This method is known as symbol correlation and known as the optimum demodulator in the maximum likelihood sense.

Figure 13:
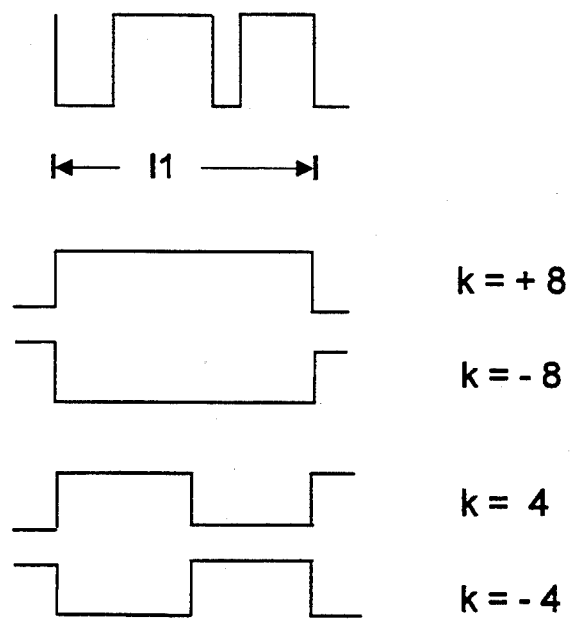
FIG. 13 shows schematically different examples for values in the symbol correlation stage.

In FIG. 13 the symbol correlation is shown for a signal received in the interval I1 as shown in FIG. 10. Underneath this signal there are shown the four possibilities of the F2F symbol set as shown in FIG. 7 and on the right hand side the correlating values k are indicated. That symbol with the highest correlation degree, k = +8 in this case is supposed to be the symbol that was sent. In the shown example of FIG. 13 it is the positive "0".

Figure 14:
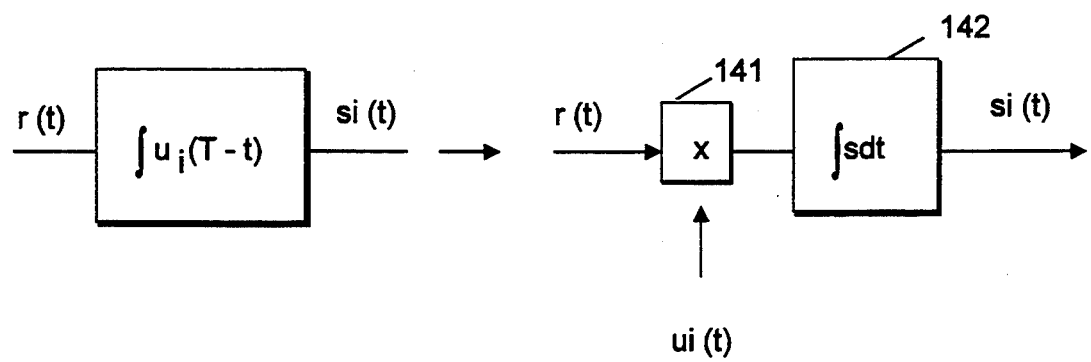
FIG. 14 shows schematically a simplified version of a matched filter and a correlator.

Signal correlation may be used to measure the degree of similarity of signals. The larger the result of the correlation, the higher the probability that the incoming signal is similar to the matched filter function. Therefore, the matched filter box shown in FIG. 12 can be replaced by the arrangement shown in FIG. 14 right hand side, that means by a multiplier 141 and an integrator 142. The multiplier multiplies the function r(t) and the second function $u_i(t)$. So if they have to correlate an analog signal the full multiplication of the signal r(t) and the signal $u_i(t)$ is performed over the estimation interval T. The resulting signal is integrated in integrator 142 to calculate the final signal $s_i(t)$.

Figure 15:
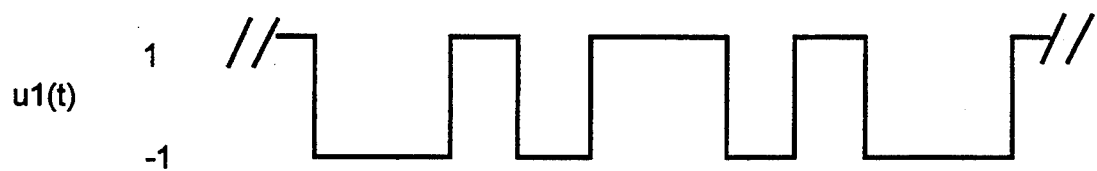
FIG. 15 shows schematically the multiplication of two functions depicted in time diagrams.
Figure 15:
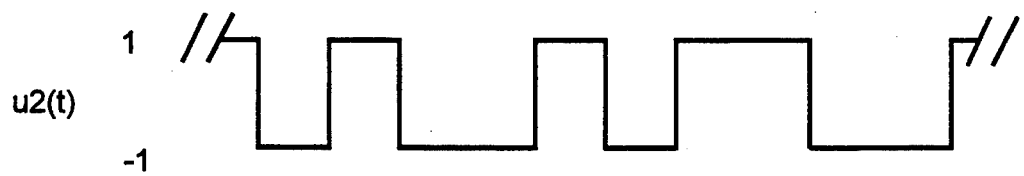
Figure 15:
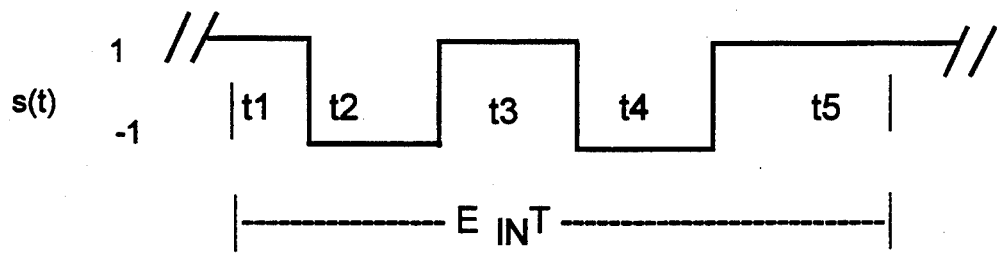

If there are binary signals then the calculation may still be simplified. To guarantee signals with the same energy, binary signals with the signal level +1 and −1 are considered. This is shown in FIG. 15. FIG. 15 shows in the first line the signal 1 ul(t) with indicated positive and negative levels +1 and −1. Exactly underneath this signal 1 there is shown in the second line the signal 2 u2(t) also depicted with the positive signal +1 and −1. These two signals are multiplied with each other and the result s(t) is shown in the third line of FIG. 15. Underneath that an estimation interval $E_{in}$ T is indicated together with the time values t1, t2, t3, t4, and t5, the different positive and negative time values for the multiplication of signal 1 * signal 2. It is known that the result of a multiplication of signal 1 and signal 2 always is a "1" or "−1" at any point. The resulting function s(t) is a "1" where both functions ul(t) and u2(t) have the same level and the resulting function is −1 where the functions have different levels. The following integration may also be simplified as it is just the difference of the time values where the signals are equal and where they differ:

$$\int_T s(t)\, dt = t1 - t2 + t3 - t4 + t5$$

What the above shows is that for binary signals the multiplication and integration of the functions to be correlated can be tremendously simplified. The correlation result is just the difference of the time values where the functions are on the same level with that time values where the function levels are different.

In accordance with the correlation explained in connection with the matched filter bank shown in FIG. 12 for the received signal r(t) have to be calculated as much correlations as there are numbers of possible symbol sequences within the estimation interval. Under consideration of the state transition as shown for the F2F coding in FIG. 8, this number increases nearly exponentially with the base of two. Therefore, at an estimation interval length of ten bits, already 1024 correlations have to be made for ten bits to determine the correct symbol sequences.

If c denotes the length of the estimation interval in bits, then the number of correlations per bit is $2^c$ divided by c.

Fading may be misinterpreted if it is not considered while the reference symbol set is generated. Therefore the phase of the reference symbol should be adapted to the actual estimated value. The correct adaption of the reference phase is essential for the quality of the correlated signals.

On the background of the aforementioned conclusions it is reasonable to keep the estimation interval length as small as possible. On the other hand it should be large enough to eliminate dropouts and glitches. Using the phase estimation as explained earlier in the description the estimation interval is already determined by the length of the correlation interval as a result from the phase estimation. It is unreasonable to work with an estimation interval of more than ten bit length.

A further improvement in signal decoding as proposed by the present invention is done by using an overlap decoding during symbol correlation. In this overlap decoding the previous correlation results are used for correlating a subsequent signal. In connection with FIG. 16 this is described in more detail. Thus, the bounds of the estimation interval reflect the margin conditions that are defined for the F2F coding scheme by the transition state diagram as shown in FIG. 8. To reflect this the correlation is done with overlapping symbol sequences. The uppermost line in FIG. 16 shows a signal sequence and the indicated estimation intervals I1, I2, and I3. The middle-line shows a signal including the two estimation intervals I1 and I2 as the minimum interval length for the estimation interval I2 and the bottom line shows the minimum estimation interval length for I3 consisting of the length of I2 and I3. This is an overlap estimation with overlap $o(i)=1$. FIG. 16 shows the estimation pattern for two bits in the estimation interval I2 and I3. To do the estimation for I2 the test pattern for I1 is used to get same weight into the integral. This method allows for consideration of margin conditions. The number of bits which will be considered from the estimation before is called the overlap length $o(i)$ and may even depend from the signal itself. The example shown in FIG. 17 demonstrates why it is advisable to use this overlap.

FIG. 17 shows in the uppermost line a received signal $r(t)$ which contains a glitch. The interval to be estimated first is the interval I2. If the estimation is done with an overlap of $o(i)=0$ (i.e., no overlap), then the signal in the middle-line would be decoded in I2 that means a "1" will be decoded. If, as shown in the bottommost line of FIG. 17, an overlap $o(i)=1$ is used (i.e., one bit overlap performed for the length including interval I1 and I2), then for the interval to be estimated I2 the most probable symbol would be a "0". As can be seen in the first estimation no overlap is assigned. The glitch at the beginning of interval I2 causes the wrong correlation result as a correlation for the interval I2 is actually the highest estimation a "1". However, regarding the margin conditions as defined in the state diagram of FIG. 8 such a symbol sequence is not allowed according to the next probable symbol would be that estimated in the second example. This can be easily acquired if the overlap length is greater than zero.

With overlap length $o(i)$ being an interval which correlates symbols beyond the interval to be estimated, the margin conditions are included into the symbol correlation and thus the error probability is decreased for the redundancy caused by the definition of the F2F coding scheme. It can be shown that for a very high overlap length the error probability will be a minimum, the calculation effort on the other hand a maximum. Therefore, a trade-off between calculation effort and error probability has to be done. In practice an overlap length of $o(i)$ of 1 or 2 is sufficient and a reasonable value.

Coming back to FIG. 9, the symbol correlator station 920 correlates the possible symbols with the sequence of flux changes within the correlation interval I. The length of the correlation interval is at least the length of the estimated phase. In using the overlap correlation the correlation interval shall be greater than just the last estimated phase. It includes at least the preceding phase interval to get into the favor of the overlap information. As the preceding interval was already to be supposed to be estimated correctly, therefore, the correlation symbol length has only to be the length of the new-phase to be estimated. The correlation value of the preceding cells, the overlap cells, may be a start value for the integration which is performed for the symbol correlation. This method reduces the calculation efforts for an overlap correlation very much.

The symbol correlator station 920 shown in FIG. 9 outputs a bit string to a bit recovery unit 922 where the bit string is checked for errors. If only one bit error exists, then the result of XOR sum of all characters which are formed by the bit string including the length record character LRC itself should be used to correct the specific character with the wrong parity. This is done in the following way:

the XOR sum of all characters is calculated by the following formula:

$$xsum = SOM \oplus Chr1 \oplus Chr2 \oplus \ldots \oplus ChrN \oplus EOM \oplus LRC.$$

The notation $\oplus$ stands for an XOR function.

One character was encountered with a parity error and only one is allowed. The correct character may be calculated as follows:

Correct Character = Defect Character $\oplus$ xsum e.g. $00100 = 00110 \oplus 00010$.

At the output 923 of the bit recovery unit 922 then the corrected data stream is present which is ready for interpretation.

Thus, the present invention provides an advantageous decoding method and decoding apparatus for signals which may contain in their digital form a lot of distortions that are open to misinterpretation, and to decode them correctly. Thus, even very worn-out magnetic stripe cards can still be read and may not be rejected by the reader. This in practice is a very important contribution in the sense of user friendliness.

Of course, many modifications and adaptations to the present invention could be made to advantage without departing from the spirit of this invention. Further some features of the present invention could be used without corresponding use of other features. Accordingly, this description should be considered as merely illustrative of the principles of the present invention and not in limitation thereof.

I claim:

1. Method for decoding F2F signals that are read from a magnetic data carrier with the help of a magnetic reading head, comprising the following steps:
   a) amplifying the analog signal read by said magnetic reading head using an amplifier of very high gain;
   b) discriminating said analog signal by applying a clip level to generate a received digital signal ($r(t)$) out of said analog signal;
   c) estimating the phase of said digital signal relative to a certain reference point (start-up time value) for determining the end of a bit cell to generate an estimation interval; and
   d) correlating said received digital signal against all possible symbol combinations during a correlation interval, wherein said correlation is performed with overlapping symbol sequences, overlapping at least for one bit, to consider margin conditions by including immediately preceding correlation results.

2. Method as in claim 1, wherein said phase estimation in step c) is performed by a minimum distance estimation using a reference phase as start point and determining a flux change that comes closest to the reference phase as the end of the bit cell.

3. Method as in claim 1, wherein said phase estimation in step c) is performed by an optimum phase estimation using an estimation interval of several bit cell lengths in which the sum of acquired time values (T(i))—measured between two adjacent flux changes—is compared to any sum of reference time values (R(j)) until the difference between these two sums is less than a decision bound b.

4. Method as in claim 1, wherein said correlation interval (I) is greater than just the last estimated phase and includes at least the immediate preceding estimation interval.

5. Method as in claim 1, wherein the result of the previous correlation is used as a start-up value for the integration which is performed for said symbol correlation.

6. Method as in claim 1, wherein the length of said correlation interval is at least the length of said estimated phase.

7. Method as in claim 1, wherein the length of the estimation interval includes a plurality of possible symbol combinations.

8. Method as in claim 1, wherein in a banking application after a symbol detection of a bit stream a bit recovery is performed, using the Length Record Character (LRC) together with the Start of Message (SOM), the End of Message (EOM) characters, and an additional odd parity bit.

9. Method as in claim 8, wherein the result of the parity check calculation and/or the LRC check calculation serves as a decision criterion to repeat the phase estimation and correlation with a modified procedure and/or parameters.

10. Device for decoding signals coded in F2F manner on a magnetic data carrier comprising:
   A) a reading station including a magnetic reading head for reading magnetically recorded signals to generate analog head signals;
   B) an amplifier station with a very high gain for amplifying said analog head signals;
   C) a discriminating and integrating station for generating a discriminated and binary looking signal;
   D) a reference time acquisition station for setting a fixed or variable start-up time value;
   E) a phase estimating station for estimating the correct end of a bit cell beginning from said start-up time value, and
   F) a symbol correlation station for correlating the received binary signal stream (r(t)) with all possible symbol combinations (ui(t)) based on said estimated phase for generating a bit stream, wherein said symbol correlation station contains an overlap decoder for correlating the signals under inclusion of previous correlation results.

11. Device as in claim 10, wherein said amplifier station comprises a low pass filter.

12. Device as in claim 10, wherein said phase estimating station includes a minimum distance estimation circuit.

13. Device as in claim 10, wherein said phase estimating station includes an optimum phase estimator.

14. Device as in claim 10, further comprising a bit recovery station for recovering a miss-read bit from the correlated bit stream.

15. Device as in claim 10, further comprising a device for determining the quality of the decoded data and, if the quality is below a certain standard, starting decoding again with modified parameters.

16. Device as in claim 15, further comprising a compare station for determining the decoding quality of all concurrently applied stations each having used modified parameters for finally selecting the best decoded signal.

17. Method for decoding F2F signals that are read from a magnetic data carrier with the help of a magnetic reading head, comprising the following steps:
   a) amplifying the analog signal read by said magnetic reading head using an amplifier of very high gain;
   b) discriminating said analog signal by applying a clip level to generate a received digital signal (r(t)) out of said analog signal;
   c) estimating the phase of said digital signal relative to a certain reference point (start-up time value) for determining the end of a bit cell to generate an estimation interval; and
   d) correlating said received digital signal against all possible symbol combinations during a correlation interval by integrating over the correlation interval (T) the product of a possible symbol combination (ui(t))—a sample—and said received digital signal (r(t))

$$\int_T ui(t) * r(t) \, dt$$

whereby this integration results in a number, performing this integration for all possible symbol combinations, and selecting the maximum result as the one coming closest to the real symbol.

18. Method as in claim 17, wherein in selecting the maximum result the absolute value of the correlation is selected.

19. Method for decoding F2F signals that are read from a magnetic data carrier with the help of a magnetic reading head, comprising the following steps:
   a) amplifying the analog signal read by said magnetic reading head using an amplifier of very high gain;
   b) discriminating said analog signal by applying a clip level to generate a received digital signal (r(t)) out of said analog signal;
   c) estimating the phase of said digital signal relative to a certain reference point (start-up time value) for determining the end of a bit cell to generate an estimation interval; and
   d) correlating said received digital signal against all possible symbol combinations during a correlation interval by multiplying two signals (ul(t), u2(t)) as binary signals of the same signal level (+1 or −1) to form a third signal (s(t)), said third signal being integrated over an estimation interval (T) by simply calculating the difference of the time where the function is on the same level with that time where the function is on the different level $$\int_T s(t) \, dt = t1 - t2 + t3 - t4 + t5.$$

* * * * *